United States Patent
Takimoto et al.

(10) Patent No.: US 10,847,668 B2
(45) Date of Patent: Nov. 24, 2020

(54) AVALANCHE PHOTODIODE

(71) Applicant: SHARP KABUSHIKI KAISHA, Osaka (JP)

(72) Inventors: Takahiro Takimoto, Sakai (JP); Kazuhiro Natsuaki, Sakai (JP); Masayo Uchida, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/338,321

(22) PCT Filed: Jun. 12, 2017

(86) PCT No.: PCT/JP2017/021652
§ 371 (c)(1),
(2) Date: Mar. 29, 2019

(87) PCT Pub. No.: WO2018/061334
PCT Pub. Date: Apr. 5, 2018

(65) Prior Publication Data
US 2020/0028019 A1 Jan. 23, 2020

(30) Foreign Application Priority Data
Sep. 29, 2016 (JP) ................................. 2016-192074

(51) Int. Cl.
*H01L 31/107* (2006.01)
*H01L 31/02* (2006.01)

(52) U.S. Cl.
CPC ...... *H01L 31/107* (2013.01); *H01L 31/02027* (2013.01)

(58) Field of Classification Search
CPC combination set(s) only.
See application file for complete search history.

(56) References Cited

U.S. PATENT DOCUMENTS 9,728,667 B1 * 8/2017 Johnson ............. H01L 27/1446
10,103,285 B1 * 10/2018 Lo ......................... H01L 31/107
(Continued)

FOREIGN PATENT DOCUMENTS

JP    H07-169991 A    7/1995

OTHER PUBLICATIONS

Justin A. Richardson et al., "A Low Dark Count Single Photon Avalanche Diode Structure Compatible with Standard Nanometer Scale CMOS Technology" (A concise explanation of the relevance can be found in paragraph [0021] of the specification of the subject application).

*Primary Examiner* — Nduka E Ojeh
(74) *Attorney, Agent, or Firm* — ScienBiziP, P.C.

(57) ABSTRACT

An avalanche photodiode includes a first-conductivity-type semiconductor layer; a first second-conductivity-type semiconductor layer; a second second-conductivity-type semiconductor layer; a third second-conductivity-type semiconductor layer; a fourth second-conductivity-type semiconductor layer; a fifth second-conductivity-type semiconductor layer.

The first-conductivity-type semiconductor layer and the second second-conductivity-type semiconductor layer form an avalanche junction. The first and third second-conductivity-type semiconductor layers are electrically connected together via the fourth second-conductivity-type semiconductor layer such that the semiconductor substrate and the first-conductivity-type semiconductor layer are electrically isolated from each other.

6 Claims, 15 Drawing Sheets

(56) References Cited

U.S. PATENT DOCUMENTS

| | | | |
|---|---|---|---|
| 2010/0245809 A1* | 9/2010 | Andreou | H01L 27/14603 356/222 |
| 2014/0191115 A1* | 7/2014 | Webster | H01L 27/14609 250/214 R |
| 2016/0218236 A1* | 7/2016 | Dhulla | H01L 27/1443 |
| 2017/0176184 A1* | 6/2017 | Lee | G01S 7/4816 |

* cited by examiner

AVALANCHE PHOTODIODE

CROSS REFERENCES TO RELATED APPLICATIONS

This application claims the benefit of priority to Japanese Patent Application No. 2016-192074, filed Sep. 29, 2016, and the entire contents of which are herein incorporated by reference.

TECHNICAL FIELD

The present invention relates to an avalanche photodiode, specifically to an avalanche photodiode that has a structure configured to prevent edge breakdown and have a uniform electric-field distribution.

BACKGROUND ART

In these years, range-finding sensors have been used for autofocus of cellular phone cameras and for determination of position or distance for automatic robots such as robotic cleaners. In particular, photosensors such as TOF (Time Of Flight) sensors employing avalanche photodiodes operating in Geiger mode have been used because these sensors can determine distance in dark fields and can be provided in reduced sizes.

Avalanche photodiodes are one type of PN diodes used so as to cause avalanche breakdown. In the Geiger mode operation of such an avalanche photodiode, a voltage higher than the withstanding voltage is applied to cause avalanche breakdown at a high probability, to thereby achieve a high amplification factor of 10,000 to 1,000,000 for incident photocarriers; as a result, the avalanche photodiode exhibits such a high sensitivity that it can detect even a single photon. Thus, the avalanche photodiode can detect light even in dark fields, and enables autofocus of cameras and determination of position for automatic robots even in the dark. The distance determined for achieving such purposes is from several tens of centimeters to several meters.

In general, the avalanche photodiode has a very high sensitivity, and hence is provided as a small photodiode having a size of about several micrometers; in order to achieve uniform operation of the device, the photodiode needs to have a uniform distribution of electric field strength. For this reason, in general, the avalanche photodiode is often designed to have a planar configuration with a circular shape or rounded corners. This is because, when the shape is, for example, quadrangle, the depletion layer does not uniformly spread in the corner portions during application of a voltage; as a result, the electric field strength becomes high locally, to cause breakdown first in the corner portions.

Even in a PN junction having a planar shape that is circular and being formed of the same diffusion structure, the edge portion of the side surface has a larger curvature than the bottom surface, and hence is subjected to a high electric field strength. As a result, breakdown first occurs in the edge portion in spite of application of the same voltage (referred to as edge breakdown).

For example, Patent Literature 1 (Japanese Unexamined Patent Application Publication No. 7-169991) describes, as illustrated in FIG. 8, an avalanche photodiode in which a high-concentration N+ diffusion layer 1019 is formed within a P-type diffusion layer 1016. FIG. 8 illustrates a light-receiving-surface antireflective film 1012, an N+ electrode 1013, a surface protective layer 1014, a channel cut 1015, a P+Si substrate 1017, a P+ layer 1018, and a surface electrode 1020.

In this avalanche photodiode, the high-concentration N+ diffusion layer 1019 and the P-type diffusion layer 1016 constitute a PN junction that causes avalanche breakdown; in order to prevent edge breakdown, the edge portion is covered with a low-concentration N-type guard ring layer 1011. Compared with the withstanding voltage of the junction between the high-concentration N+ diffusion layer 1019 and the P-type diffusion layer 1016, the junction between the P-type diffusion layer 1016 and the N-type guard ring layer 1011 has a high withstanding voltage, so that edge breakdown is prevented.

Referring to FIG. 9, another guard ring structure used for preventing the edge breakdown but having the opposite polarity will be described. FIG. 9 illustrates a high-concentration N-type diffusion layer 1105 serving as a cathode diffusion layer, a high-concentration P-type diffusion layer 1107, a gate oxide film 1111, an oxide film 1112, an anode electrode A, a cathode electrode C, and a substrate electrode S.

As illustrated in FIG. 9, an N-type diffusion layer 1102 is formed within a P-type semiconductor substrate 1101. Subsequently, a high-concentration P-type diffusion layer 1103 serving as an anode diffusion layer is formed; in order to cause avalanche breakdown, a high-concentration N-type diffusion layer 1104 is formed. Subsequently, in order to prevent edge breakdown, a P-well diffusion layer 1106 is formed in the edge portion of the high-concentration P-type diffusion layer 1103. As a result, compared with the withstanding voltage of the junction between the high-concentration P-type diffusion layer 1103 and the high-concentration N-type diffusion layer 1104, the junction between the N-type diffusion layer 1102 and the P-well diffusion layer 1106 has a high withstanding voltage, so that edge breakdown does not occur.

The above-described avalanche photodiode structure in Patent Literature 1 is provided so as to address edge breakdown; however, in order to achieve higher performance, the avalanche junction itself needs to have a decreased junction concentration. This is because high junction concentration causes steeper band curves between the P-type diffusion layer and the N-type diffusion layer forming the junction, which causes generation of a noise component of band-to-band tunneling mode, resulting in an increase in the dark count noise.

This will be described with reference to FIG. 10. FIG. 10 illustrates a P-type semiconductor substrate 1201, an N-type diffusion layer 1202, a high-concentration N-type diffusion layer 1205 serving as a cathode diffusion layer, a gate oxide film 1211, an oxide film 1212, an anode electrode A, a cathode electrode C, and a substrate electrode S.

In FIG. 9 described above, the avalanche junction is formed by the high-concentration P-type diffusion layer 1103 and the high-concentration N-type diffusion layer 1104. In general, the P-type diffusion layer 1103 is formed together with the MOS source/drain diffusion layer, and hence formed by ion implantation at about $1.0E+15$ $cm^{-2}$, which results in a high junction concentration.

On the other hand, in FIG. 10, the avalanche junction is formed by a P-well diffusion layer 1206 and a high-concentration N-type diffusion layer 1204. The P-well diffusion layer 1206 has a lower concentration than a P-type diffusion layer 1203, to thereby achieve a reduction in the above-described noise component of tunneling mode. In the case in FIG. 9, the P-well diffusion layer 1106 is used as the guard ring; however, such a guard ring cannot be used in the structure in FIG. 10, so that another structure is required to address edge breakdown.

This is addressed by Non Patent Literature 1 ("A Low Dark Count Single Photon Avalanche Diode Structure Compatible with Standard Nanometer Scale CMOS Technology"), which proposes an avalanche photodiode having a structure in which an avalanche junction is formed by a P well and an N-type diffusion layer to achieve a reduction in the junction concentration, while edge breakdown is addressed.

This avalanche photodiode will be specifically described with reference to FIG. 11. FIG. 11 illustrates a P-type diffusion layer 1303, an N-type diffusion layer 1306, a low-concentration P-type diffusion layer 1307, a gate polysilicon 1308, a selective oxide film STI 1310, a gate oxide film 1311, an oxide film 1312, a high-concentration P-type diffusion layer 1320, an anode electrode A, a cathode electrode C, and a substrate electrode S.

In the case of the avalanche photodiode in FIG. 11, within a P-type semiconductor substrate 1301, a low-concentration P-type well diffusion layer 1302, the high-concentration P-type diffusion layer 1303, and an N-type well diffusion layer 1304 are first formed. At this time, a region 1309 having no diffusion (virtual guardring) is provided between the P-type well diffusion layer 1302 and the N-type well diffusion layer 1304. In addition, a high-concentration N-type buried diffusion layer 1305 is formed so as to connect to the bottom surface portion of the P-type well diffusion layer 1302 and a portion (closer to the P-type well diffusion layer 1302) of the bottom surface portion of the N-type well diffusion layer 1304.

As a result, the P-type well diffusion layer 1302 and the high-concentration N-type buried diffusion layer 1305 form an avalanche junction; and the P-type well diffusion layer 1302 and the low-concentration region 1309 (virtual guardring) form an edge portion.

Compared with the withstanding voltage of the junction of the avalanche photodiode in FIG. 10, the avalanche photodiode in FIG. 11 has a higher withstanding voltage of the junction, and hence provides a structure that prevents edge breakdown.

CITATION LIST

Patent Literature

PTL 1: Japanese Unexamined Patent Application Publication No. 7-169991

Non Patent Literature

NPL 1: Justin A. Richardson and three others, "A Low Dark Count Single Photon Avalanche Diode Structure Compatible with Standard Nanometer Scale CMOS Technology", [online], 2009 International Image Sensor Workshop, [searched Sep. 5, 2016], Internet <URL: http://www.imagesensors.org/Past%20Workshop/2009%20Papers/063_paper_richardson_spad.pd>

SUMMARY OF INVENTION

Technical Problem

However, the above-described avalanche photodiode of NPL 1 having the structure in FIG. 11 has the following problem.

In the avalanche photodiode, as the cathode diffusion layers, the P-type well diffusion layer 1302 and the N-type buried diffusion layer 1305 are formed; during Geiger mode operation of the avalanche photodiode, to the cathode electrode C, a high voltage exceeding the withstanding voltage is applied. At this time, the N-type buried diffusion layer 1305 has a small width in the depth direction, so that the cathode resistance is high. During application of a high voltage exceeding the withstanding voltage to the cathode electrode C, a current flows between the cathode electrode C and the anode electrode A; the current flows through a quenching resistor and a MOS resistor connected in series to cause a voltage drop, which results in a decrease in the voltage substantially applied to the avalanche junction portion of the avalanche photodiode.

This results in quenching of the current flowing through the avalanche photodiode (quenching mechanism). Thus, although high current flows between the cathode electrode C and the anode electrode A during Geiger mode operation, internal resistors such as the cathode resistor cause a potential drop, so that a sufficiently high voltage is not applied to the site of the avalanche junction. In the avalanche junction, a region closer to the cathode electrode C has a high potential, while a central region far from the cathode electrode C has a low potential. Thus, the electric field strength has a distribution in which it is lower in the center of the avalanche junction, while it is higher in the edge region. Therefore, the avalanche photodiode does not uniformly operate over the whole region of the avalanche junction.

The present invention proposes the structure of an avalanche photodiode that avoids the edge breakdown and generation of noise of tunneling mode, and that provides a uniform distribution of electric field strength to thereby achieve uniform operation over the whole region of the avalanche junction.

Solution to Problem

An avalanche photodiode according to an aspect of the present invention includes:

a first-conductivity-type semiconductor layer formed within a first-conductivity-type semiconductor substrate;

a first second-conductivity-type semiconductor layer formed within the semiconductor substrate so as to surround, in plan view for the semiconductor substrate, with a gap width, the first-conductivity-type semiconductor layer;

a second second-conductivity-type semiconductor layer formed, within the semiconductor substrate, deeper than the first-conductivity-type semiconductor layer and in contact with at least a portion of a bottom portion of the first-conductivity-type semiconductor layer; and a third second-conductivity-type semiconductor layer formed, within the semiconductor substrate, deeper than the second second-conductivity-type semiconductor layer and in contact with a bottom portion of the second second-conductivity-type semiconductor layer, wherein the first-conductivity-type semiconductor layer and the second second-conductivity-type semiconductor layer form an avalanche junction, and the first second-conductivity-type semiconductor layer and the third second-conductivity-type semiconductor layer are connected together such that the semiconductor substrate and the first-conductivity-type semiconductor layer are electrically isolated from each other.

Advantageous Effects of Invention

As is clear from what has been described, the present invention provides an avalanche photodiode that avoids edge breakdown and generation of noise of tunneling mode due to a high-concentration avalanche junction, and that has a uniform distribution of electric field strength to thereby achieve uniform operation over the whole region of the avalanche junction.

DESCRIPTION OF EMBODIMENTS

Figure 1:
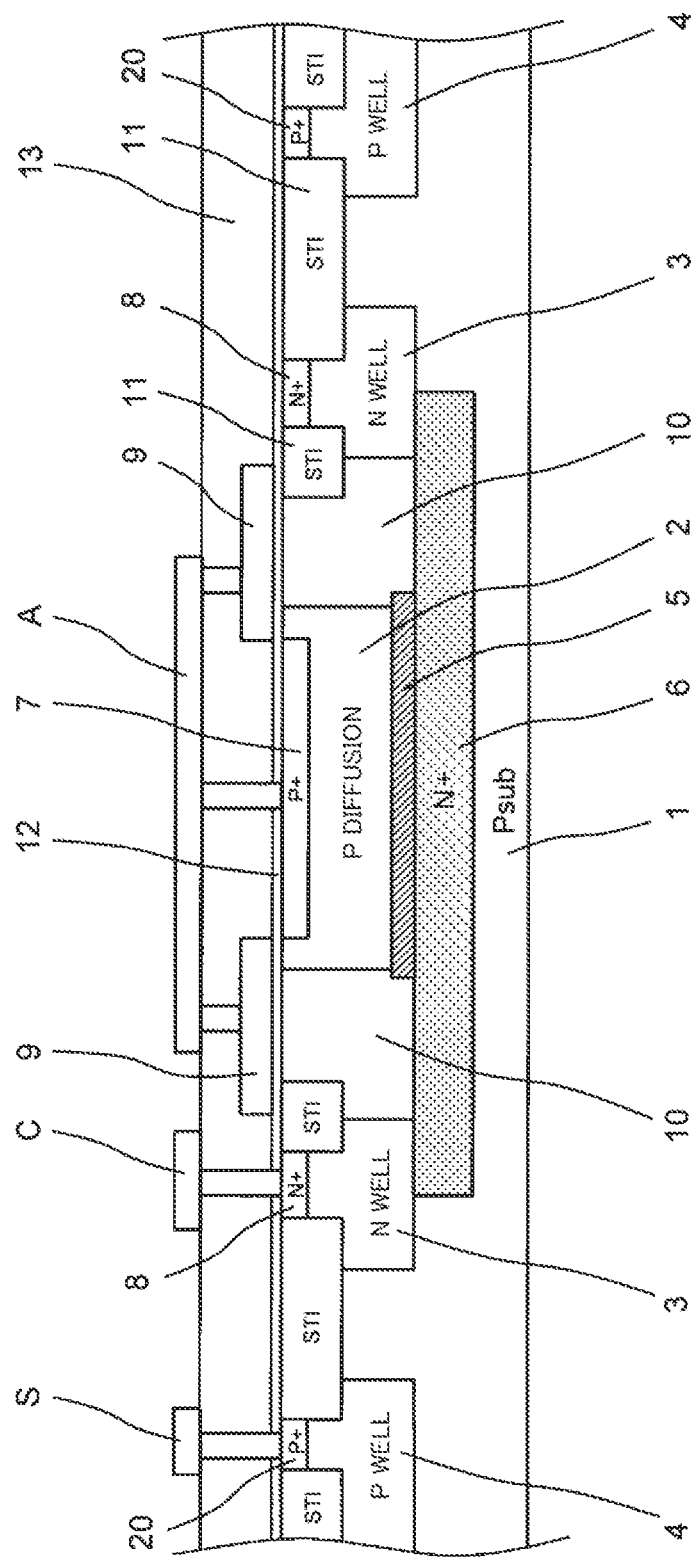
FIG. 1 is a sectional view of an avalanche photodiode according to a first embodiment of the present invention.

Hereinafter, avalanche photodiodes according to the present invention will be described in detail with reference to embodiments illustrated in the drawings. Incidentally, the following first to fifth embodiments will be described such that the first conductivity type is a P type, and the second conductivity type is an N type.

First Embodiment

An avalanche photodiode according to the first embodiment of the present invention will be specifically described with reference to FIG. 1.

FIG. 1 is a sectional view of the avalanche photodiode according to the first embodiment of the present invention. In this avalanche photodiode, within a silicon semiconductor substrate 1, which, for example, has a plane orientation of (100) and a resistivity of about 10 Ωcm and is of P type, a low-concentration P-type diffusion layer 2 is formed, which serves as a P-type diffusion layer of an avalanche junction. This low-concentration P-type diffusion layer 2 is formed by ion implantation of boron ($^{11}$B+). For example, boron ($^{11}$B+) is implanted under the following three-stage ion implantation conditions.

| [Ion implantation energy] | [Dose] |
|---|---|
| 200 keV | 2.5E+12 cm$^{-2}$ |
| 50 keV | 2.5E+12 cm$^{-2}$ |
| 35 keV | 1.0E+13 cm$^{-2}$ |

Incidentally, the dose is described with floating-point representation in which an exponential base of 10 is represented by symbol E. For example, 1.0E+12 represents $1.0 \times 10^{12}$.

The silicon semiconductor substrate 1 is an example of the first-conductivity-type semiconductor substrate. The low-concentration P-type diffusion layer 2 is an example of the first-conductivity-type semiconductor layer.

Subsequently, a low-concentration N-type diffusion layer 3 serving as a cathode diffusion layer (N well) is formed within the silicon semiconductor substrate 1 so as to surround, in plan view for the silicon semiconductor substrate 1, with a gap width, the low-concentration P-type diffusion layer 2. The gap width is desirably set to about 1.0 to about 3.0 μm. This is because, although the N-type diffusion layer 3 is isolated by a selective oxide film STI (Shallow Trench Isolation) 11, STI generally contains defects, and a contact of a depletion layer from the P-type diffusion layer 2 with the defect layer results in degradation of noise characteristics. This low-concentration N-type diffusion layer 3 is also formed by ion implantation. For example, phosphorus ($^{31}$P+) is implanted under the following two-stage ion implantation conditions.

| [Ion implantation energy] | [Dose] |
|---|---|
| 440 keV | 1.5E+13 cm$^{-2}$ |
| 150 keV | 5.0E+12 cm$^{-2}$ |

The low-concentration N-type diffusion layer 3 is an example of the first second-conductivity-type semiconductor layer.

Subsequently, a low-concentration P-type diffusion layer 4 serving as a P well is formed within the silicon semiconductor substrate 1 so as to surround, in plan view for the silicon semiconductor substrate 1, with a gap width, the low-concentration N-type diffusion layer 3. This low-concentration P-type diffusion layer 4 is formed by implanting boron ($^{11}$B+) by ion implantation.

Subsequently, a high-concentration N-type buried diffusion layer 5 serving as an N-type diffusion layer of the avalanche junction is formed. For example, ion implantation of phosphorus ($^{31}$P+) is performed at an ion implantation energy of 540 keV at a dose of 6.0E+12 cm$^{-2}$ to form the N-type buried diffusion layer 5. In this example, the above-described low-concentration P-type diffusion layer 2 and this N-type buried diffusion layer 5 form the avalanche junction. This P-type diffusion layer 2 has a low concentration that is approximately a concentration for well diffusion, so that noise of tunneling mode is not generated.

The N-type buried diffusion layer 5 is an example of the second second-conductivity-type semiconductor layer formed so as to be in contact with the bottom portion of the low-concentration P-type diffusion layer 2 (first-conductivity-type semiconductor layer).

Subsequently, a high-concentration N-type buried diffusion layer 6 is formed deeper than the N-type buried diffusion layer 5 so as to connect to the low-concentration N-type diffusion layer 3. This achieves electric isolation between the anode portion formed of the low-concentration P-type diffusion layer 2 and the P-type semiconductor substrate 1. This N-type buried diffusion layer 6 is formed by, for example, ion implantation of phosphorus ($^{31}$P+) at an ion implantation energy of 1.5 MeV at a dose of 6.0E+12 cm$^{-2}$, and subsequent heat treatment such as annealing at 800° C. to 900° C.

The N-type buried diffusion layer 6 is an example of the third second-conductivity-type semiconductor layer.

Subsequently, a selective oxide film STI (Shallow Trench Isolation) 11 is formed on the front surface side of the silicon semiconductor substrate 1 in order to achieve device isolation by electric isolation between the anode and the cathode, between the cathode and the silicon semiconductor substrate 1, and between the photodiodes.

Subsequently, a gate oxide film 12 is formed on the silicon semiconductor substrate 1. In addition, on the gate oxide film 12, a gate polysilicon 9 is formed so as to cover the region between the low-concentration P-type diffusion layer 2 and the low-concentration N-type diffusion layer 3.

Subsequently, a high-concentration P-type diffusion layer 7 is formed in an upper portion of the low-concentration P-type diffusion layer 2 so as to form an ohmic contact with an anode electrode A. In addition, a high-concentration P-type diffusion layer 20 is formed in an upper portion of the low-concentration P-type diffusion layer 4 so as to form an ohmic contact with a substrate electrode S. In addition, a high-concentration N-type diffusion layer 8 is formed in an upper portion of the low-concentration N-type diffusion layer 3 so as to form an ohmic contact with a cathode electrode C. At this time, the region between the low-concentration P-type diffusion layer 2 and the low-concentration N-type diffusion layer 3 is covered by the gate polysilicon 9; as a result, in this region, no diffusion occurs and the high-concentration P-type diffusion layer 7 and the N-type diffusion layer 8 are not formed. Thus, the structure has the virtual guardring 10 formed between the low-concentration P-type diffusion layer 2 and the low-concentration N-type diffusion layer 3, to thereby prevent edge breakdown.

Subsequently, for example, CVD (Chemical Vapor Deposition) and CMP (Chemical Mechanical Polish) are performed to form a silicon oxide film 13 serving as a field film. Subsequently, in or on the silicon oxide film 13, contact holes and a metal film having a thickness of about 500 nm and formed of AlCu are formed for forming the anode electrode A, the cathode electrode C, and the substrate electrode S. This process is repeated several times, and then a passivation film (not shown) is formed, to thereby provide the avalanche photodiode structure illustrated in FIG. 1. Incidentally, the gate polysilicon 9 is short-circuited to the anode electrode A, and connected through the anode electrode A to the quenching resistor.

The avalanche photodiode having this structure has features that the N-type buried diffusion layer 5 forming the avalanche junction and the N-type buried diffusion layer 6 serving as the cathode diffusion layer are separately formed, and the N-type buried diffusion layer 6 is formed deeper than the N-type buried diffusion layer 5.

Figure 2A:
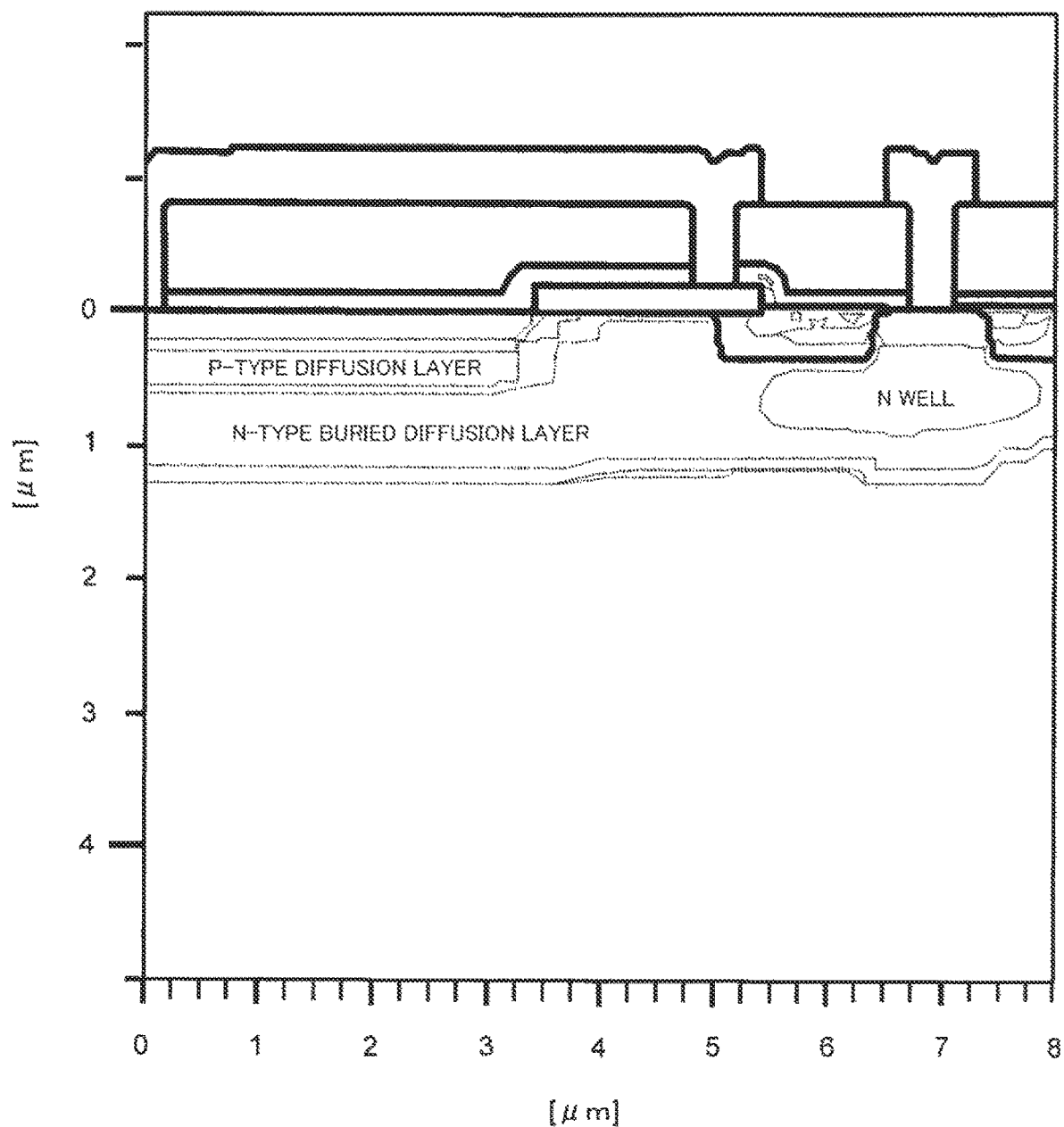
FIG. 2A is a sectional view of an existing avalanche photodiode (simulation).
Figure 2B:
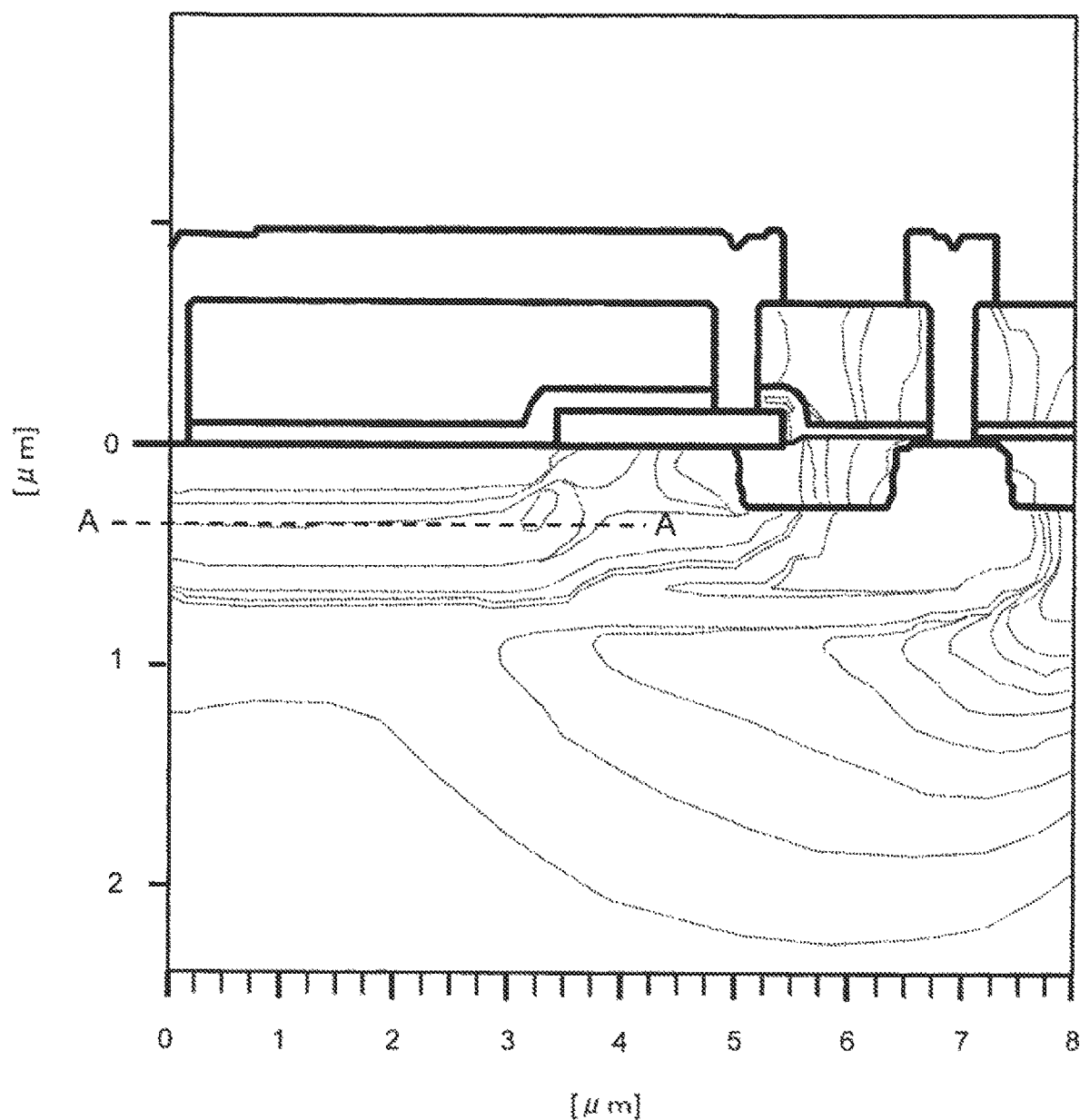
FIG. 2B illustrates the distribution of electric field strength in the existing avalanche photodiode (simulation).
Figure 2C:
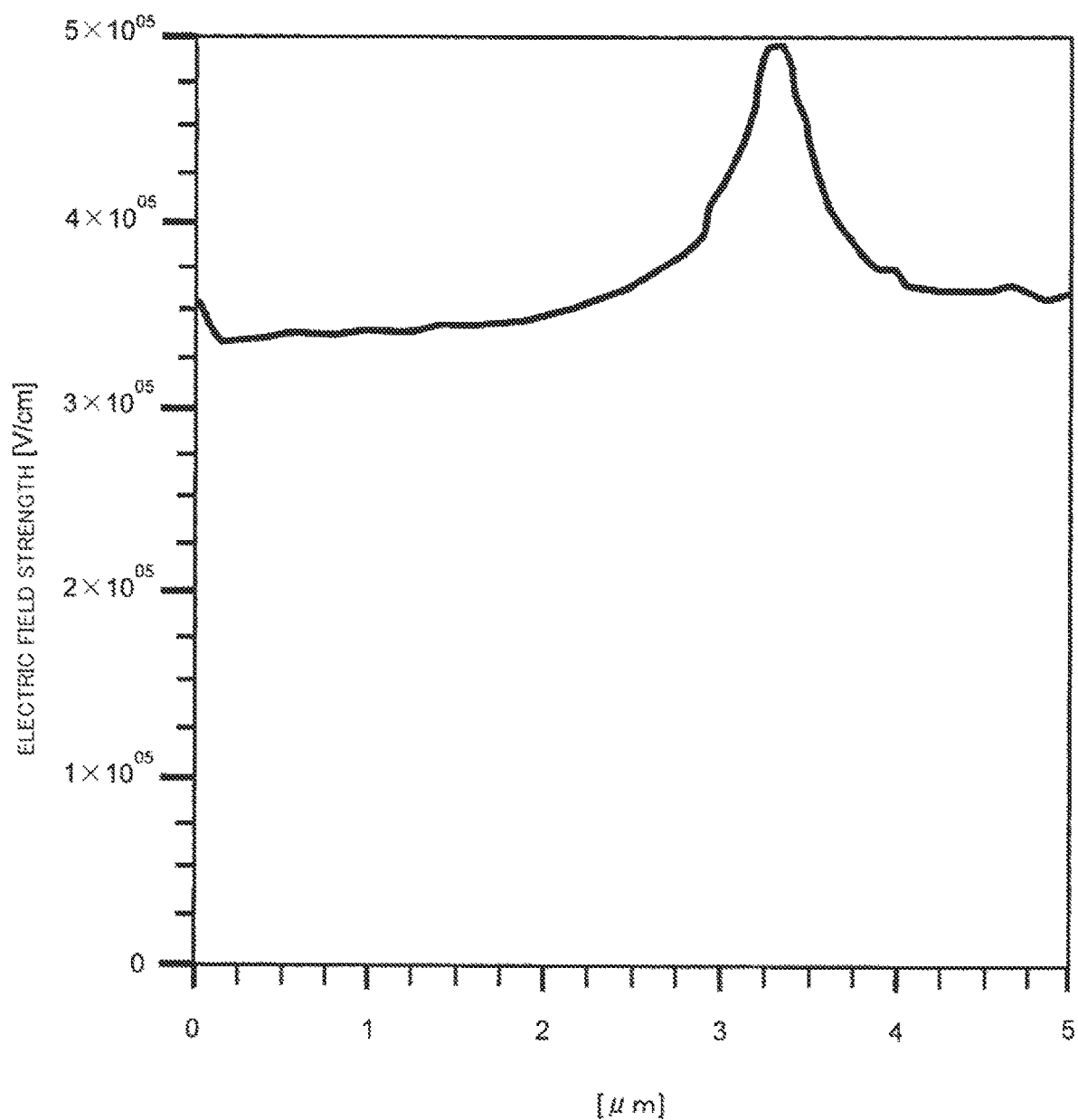
FIG. 2C illustrates the distribution of electric field strength in portion A-A of the existing avalanche photodiode (simulation).
Figure 11:
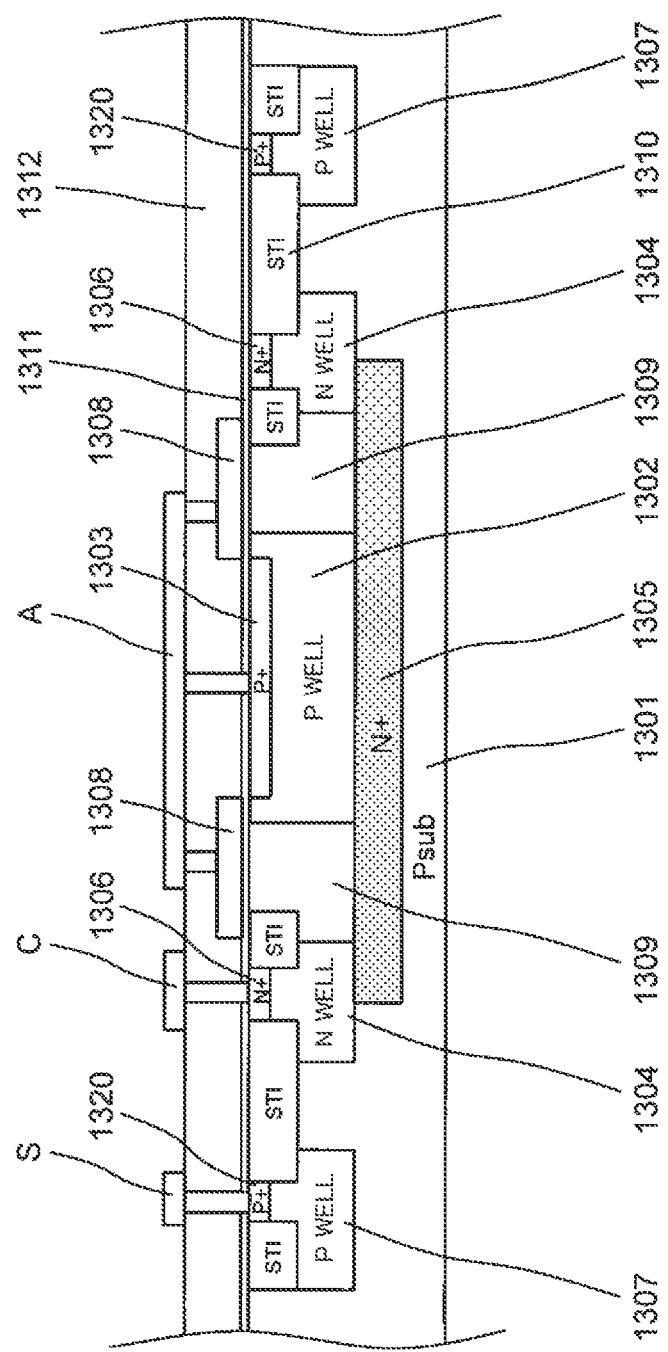
FIG. 11 is a sectional explanatory view of the structure of an existing avalanche photodiode.

FIG. 2A to FIG. 2C illustrate device simulation results of the existing avalanche photodiode having the structure illustrated in FIG. 11. FIG. 2A illustrates the distribution of P-type and N-type impurity concentrations in a section of a major portion of the avalanche photodiode. FIG. 2B illustrates the two-dimensional distribution of electric field strength in the section of the avalanche photodiode. In FIG. 2A and FIG. 2B, the abscissa axis indicates length [μm] in the horizontal direction, and the ordinate axis indicates length [μm] in the depth direction from the surface of the substrate.

FIG. 2C illustrates the electric field strength of portion A-A extending in the horizontal direction in FIG. 2B. In FIG. 2C, the abscissa axis indicates length [μm] in the horizontal direction, and the ordinate axis indicates electric field strength [V/cm].

This FIG. 2C indicates the presence of a portion having a high electric field strength at and near the edge of the P-type diffusion layer 304 in the junction between the N-type buried diffusion layer 305 and the P-type diffusion layer 304.

Figure 3A:
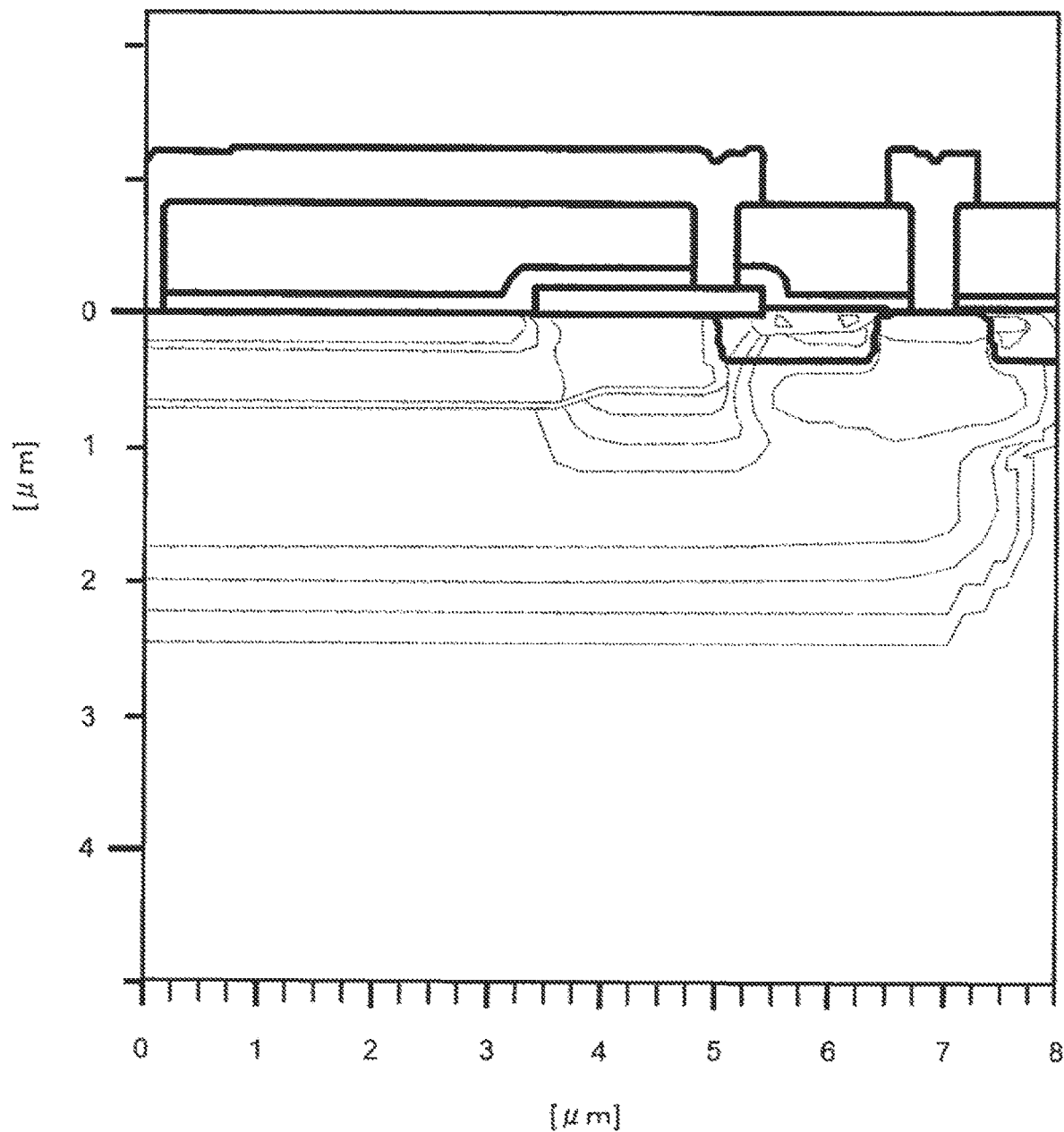
FIG. 3A is a sectional view of the avalanche photodiode according to the first embodiment of the present invention (simulation).
Figure 3B:
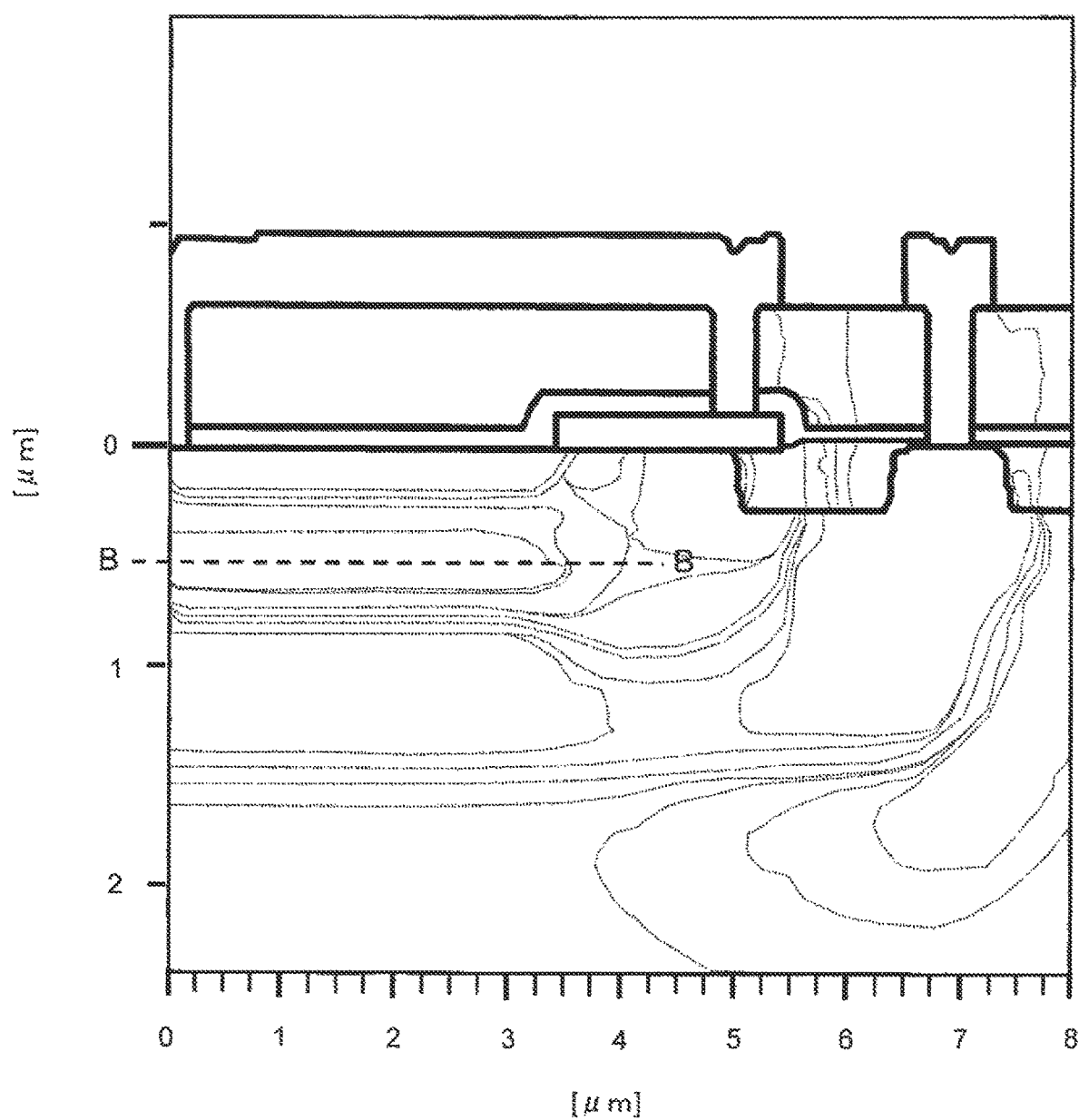
FIG. 3B illustrates the distribution of electric field strength of the avalanche photodiode according to the first embodiment of the present invention (simulation).
Figure 3C:
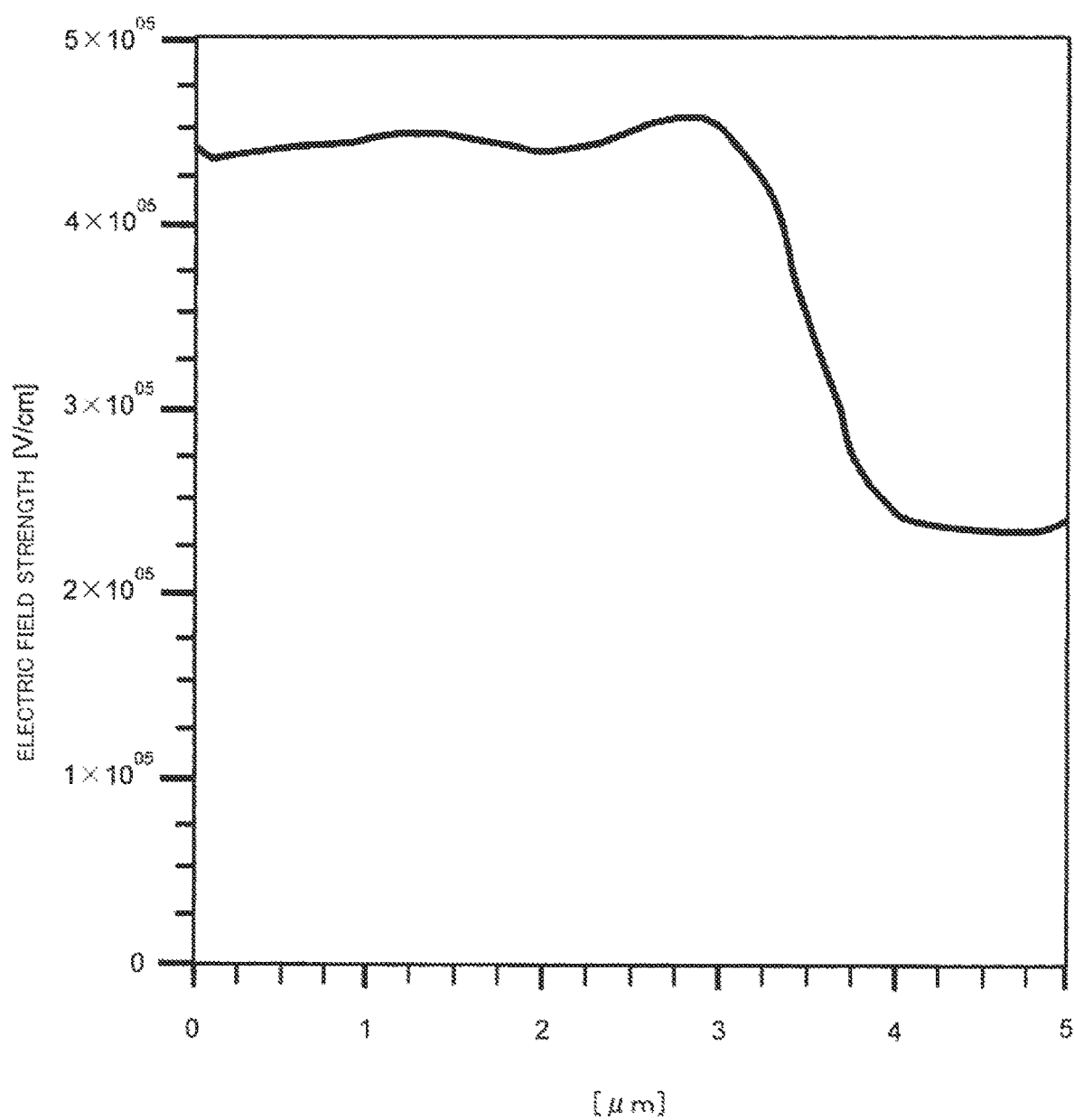
FIG. 3C illustrates the distribution of electric field strength in portion B-B of the avalanche photodiode according to the first embodiment of the present invention (simulation).

On the other hand, FIG. 3A to FIG. 3C illustrate device simulation results of an avalanche photodiode having a structure according to the present invention. FIG. 3A illustrates the distribution of P-type and N-type impurity concentrations in a section of a major portion of the avalanche photodiode. FIG. 3B illustrates the two-dimensional distribution of electric field strength of the section of the avalanche photodiode. In FIG. 3A and FIG. 3B, the abscissa axis indicates length [μm] in the horizontal direction, and the ordinate axis indicates length [μm] in the depth direction from the surface of the substrate. FIG. 3C illustrates the electric field strength of portion B-B extending in the horizontal direction in FIG. 3B.

FIG. 3C has demonstrated that the avalanche photodiode according to the first embodiment of the present invention avoids edge breakdown and noise of tunneling mode due to a high-concentration avalanche junction, and also provides the uniform distribution of electric field strength.

The above-described results of the existing avalanche photodiode in FIG. 11 are provided because, in the structure, the N-type buried diffusion layer 305 forming the avalanche junction connects itself to the cathode electrode C, so that the amount of potential drop due to the high cathode resistance directly results in the difference in electric field strength (electric field strength depends on potential difference and distance; since the distance remains the same, the region having a high potential is locally generated).

By contrast, as illustrated in FIG. 1, an avalanche photodiode according to the present invention has a structure in which the N-type buried diffusion layer 6 connecting to the cathode electrode C and the N-type buried diffusion layer 5 forming the avalanche junction are separately formed; the potential drop due to the cathode electrode C causes a high potential at and near the edge of the low-concentration P-type diffusion layer 2; however, the N-type buried diffusion layer 6 is formed deeper than the N-type buried diffusion layer 5, so that the N-type buried diffusion layer 6 is disposed farther from the low-potential anode diffusion layer (P-type diffusion layer 2) to thereby decrease the electric field strength and provide a uniform distribution of the electric field strength.

Incidentally, in an avalanche photodiode according to the present invention, the region having a high potential is similarly generated; however, the region having a high potential is disposed in a deeper position to increase the distance, so as not to reach a high electric field strength.

In the first embodiment according to the present invention, the N-type buried diffusion layer 5 is formed by ion implantation of phosphorus ($^{31}$P+) at 540 keV, and the N-type buried diffusion layer 6 is formed by ion implantation of phosphorus ($^{31}$P+) at 1.5 MeV. When the ion implantation energy for forming the N-type buried diffusion layer 6 is close to the ion implantation energy for forming the N-type buried diffusion layer 5, the effect of forming the high-potential region at a deeper position to increase the distance lessens, so that the electric field strength increases.

For this reason, when the N-type buried diffusion layer 5 is formed with phosphorus ($^{31}$P+) at an ion implantation energy of 540 keV, the ion implantation energy for forming the N-type buried diffusion layer 6 with phosphorus ($^{31}$P+) is preferably set to at least 1 MeV or more.

Conversely, when the ion implantation energy for forming the N-type buried diffusion layer 6 is excessively high, electric isolation between the low-concentration P-type diffusion layer 2 and the P-type semiconductor substrate 1 is not sufficiently achieved; for this reason, the ion implantation energy is preferably set to 3 MeV or less.

The first embodiment according to the present invention has been described with the avalanche photodiode structure constituted by the low-concentration P-type diffusion layer 2, the high-concentration N-type buried diffusion layer 5, and the high-concentration N-type buried diffusion layer 6. Clearly, such a structure but having inverted polarities also provides the same results. Incidentally, boron ($^{11}$B+) and phosphorus ($^{31}$P+) are different in implanted depth at an ion implantation energy, and hence it is clear that the ion implantation energy and the dose need to be optimized.

Second Embodiment

Figure 4:
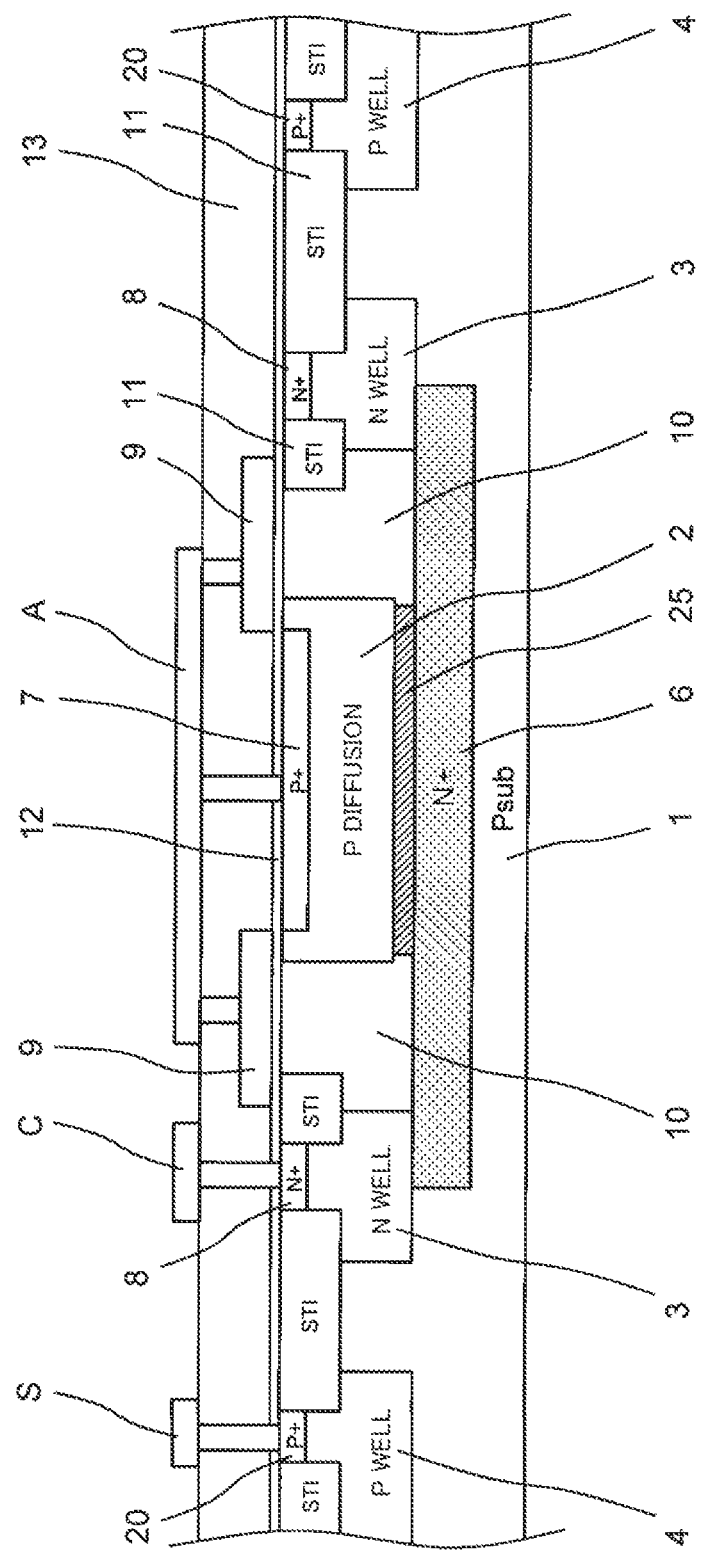
FIG. 4 is a sectional view of an avalanche photodiode according to a second embodiment of the present invention.

An avalanche photodiode according to a second embodiment of the present invention will be described with reference to FIG. 4. The basic configuration is the same as in the first embodiment. This avalanche photodiode according to the second embodiment has the same configuration as in the avalanche photodiode according to the first embodiment except for an N-type buried diffusion layer 25.

In the avalanche photodiode according to the second embodiment, the N-type buried diffusion layer 25 forming the avalanche junction is formed smaller than, in plan view for the substrate, the bottom portion of the low-concentration P-type diffusion layer 2.

As in the first embodiment, even when the N-type buried diffusion layer 5 forming the avalanche junction is formed larger than the low-concentration P-type diffusion layer 2, as long as it is substantially not connected to the N-type diffusion layer 3, the potential does not automatically become high, so that the above-described advantages are basically provided. However, in the configuration in which an N-type buried diffusion layer having the same size as the low-concentration P-type diffusion layer 2 are bonded together to form an avalanche junction, the larger the curvature of the diffusion edge, the higher the electric field strength of the edge portion, so that there is a concern of occurrence of edge breakdown.

Thus, as in the avalanche photodiode according to the third embodiment of the present invention, the N-type buried diffusion layer 25 is formed smaller than, in plan view for the substrate, the bottom portion of the low-concentration P-type diffusion layer 2. As a result, the above-described concern is dismissed, and the avalanche photodiode having a more perfect configuration is obtained.

As with the avalanche photodiode according to the first embodiment, the avalanche photodiode according to the second embodiment may be constituted with inverted polarities, which clearly provides the same results.

Third Embodiment

Figure 5:
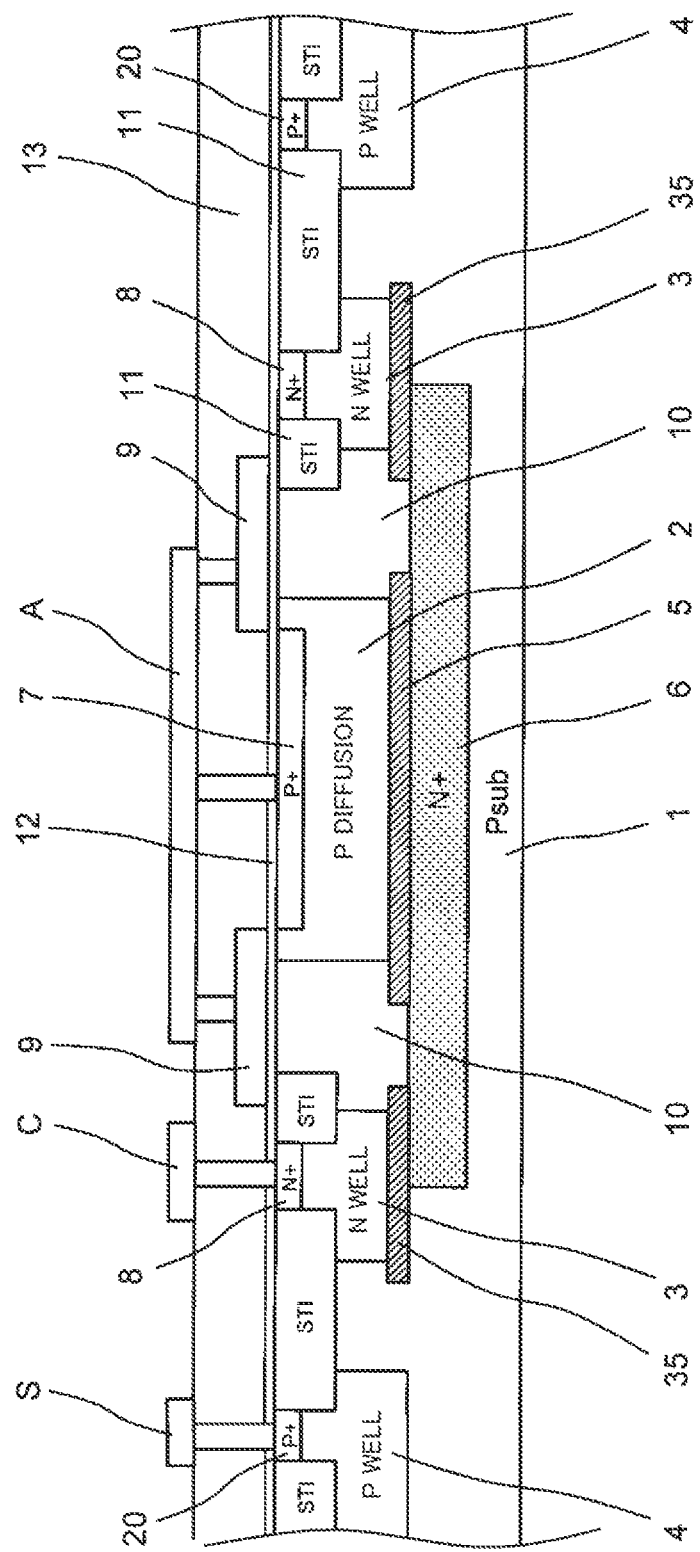
FIG. 5 is a sectional view of an avalanche photodiode according to a third embodiment of the present invention.

An avalanche photodiode according to a third embodiment of the present invention will be described with reference to FIG. 5. The basic configuration is the same as in the first embodiment. The difference from the avalanche photodiode according to the first embodiment is another high-concentration N-type buried diffusion layer 35 formed between the N-type diffusion layer 3 serving as the cathode diffusion layer and the N-type buried diffusion layer 6. This N-type buried diffusion layer 35 is an example of the fourth second-conductivity-type semiconductor layer.

As described in the end of the first embodiment, when the N-type buried diffusion layer 6 is formed at a high ion implantation energy and, as a result, formed at a deep position, the contact concentration between the N-type diffusion layer 3 and the N-type buried diffusion layer 6 becomes low, and the isolation strength between the low-concentration P-type diffusion layer 2 and the P-type semiconductor substrate 1 becomes insufficient. As a result, leakage occurs, and the cathode resistance becomes high, so that the voltage applied to the cathode electrode C cannot be more efficiently applied to the avalanche junction, which is problematic.

Avalanche photodiodes are devices operated by application of voltages higher than the withstanding voltages. Thus, a high voltage of at least about 10 to about 20 V needs to be applied. In general, such a voltage is generated in the internal circuit of IC. Thus, more efficient application of the applied voltage, to the avalanche junction, leads to higher-performance avalanche-photodiode characteristics. In general, PDE, which stands for photon detection efficiency and is one of important characteristics of avalanche photodiodes, increases as the voltage applied increases from the withstanding voltage, which leads to devices having higher sensitivity.

Thus, in the configuration of the avalanche photodiode according to the third embodiment of the present invention, the N-type buried diffusion layer 35 is formed between the N-type diffusion layer 3 and the N-type buried diffusion layer 6, to thereby address the above-described problem without any increase in the costs or in the number of steps.

As in the first embodiment, the avalanche photodiode according to the third embodiment may be constituted with inverted polarities, which clearly provides the same results.

Fourth Embodiment

Figure 6:
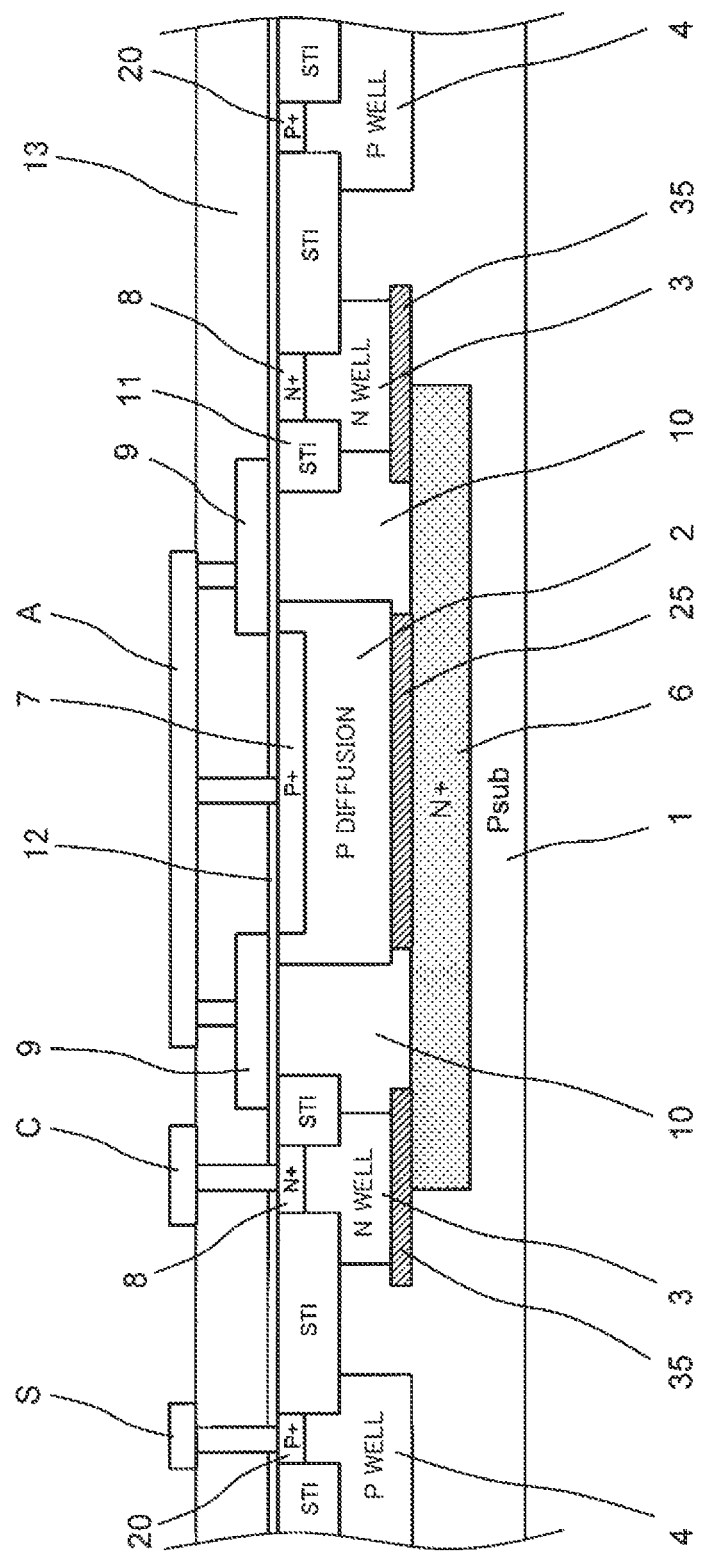
FIG. 6 is a sectional view of an avalanche photodiode according to a fourth embodiment of the present invention.

An avalanche photodiode according to a fourth embodiment of the present invention will be described with reference to FIG. 6. This embodiment is basically a combination of the second embodiment and the third embodiment according to the present invention.

The N-type buried diffusion layer 25 forming the avalanche junction is formed smaller than, in plan view for the substrate, the bottom portion of the low-concentration P-type diffusion layer 2. As a result, the diffusion edge has a large curvature, and the electric field strength increases in the edge portion. Thus, occurrence of edge breakdown is prevented.

As in the above-described first to third embodiments, the avalanche photodiode according to the fourth embodiment may be constituted with inverted polarities, which clearly provides the same results.

Fifth Embodiment

Figure 7:
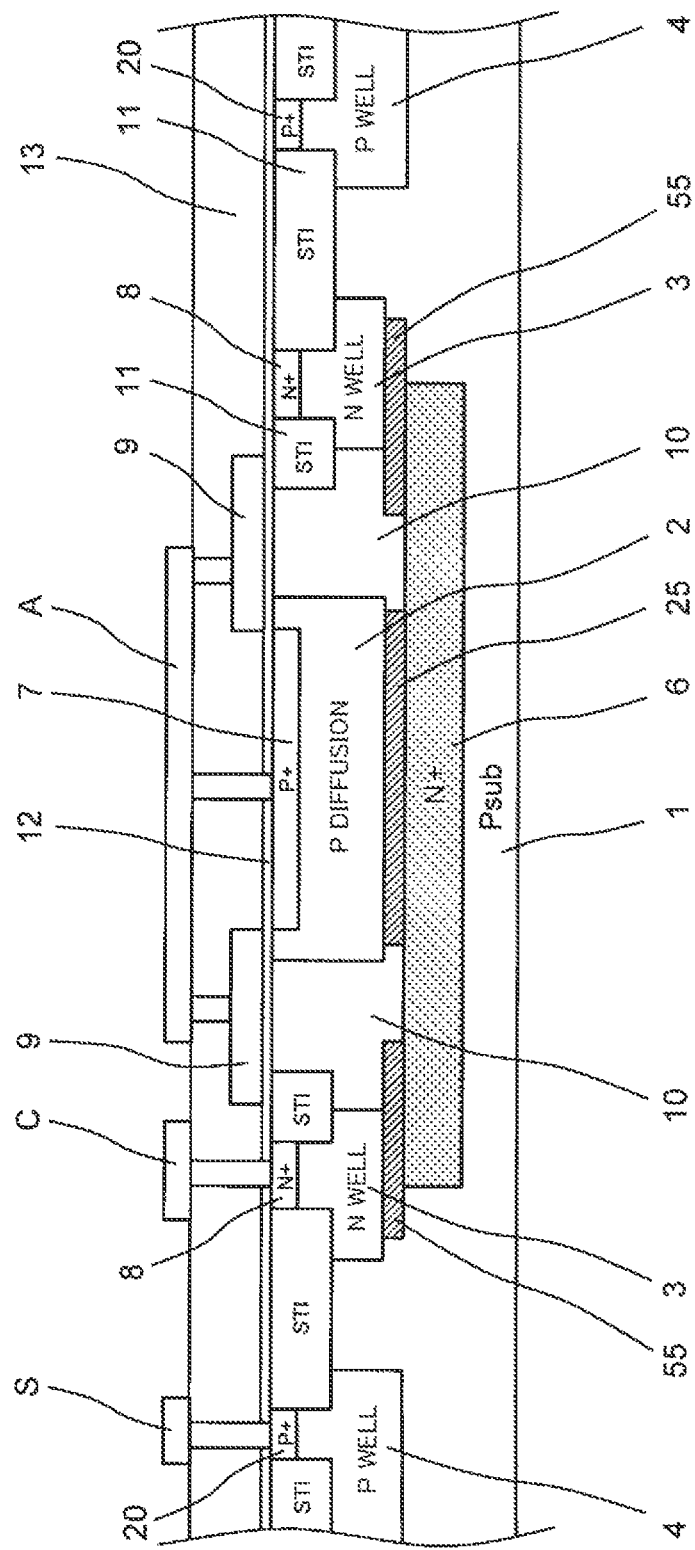
FIG. 7 is a sectional view of an avalanche photodiode according to a fifth embodiment of the present invention.
Figure 8:
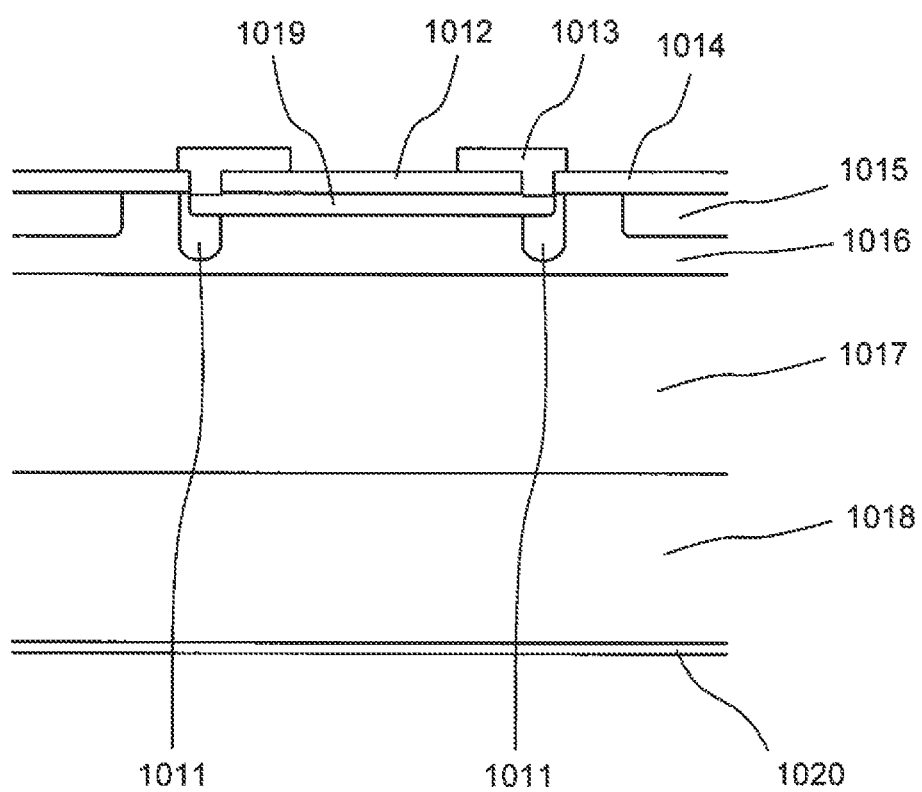
FIG. 8 is a sectional view of an avalanche photodiode described in PTL 1.
Figure 9:
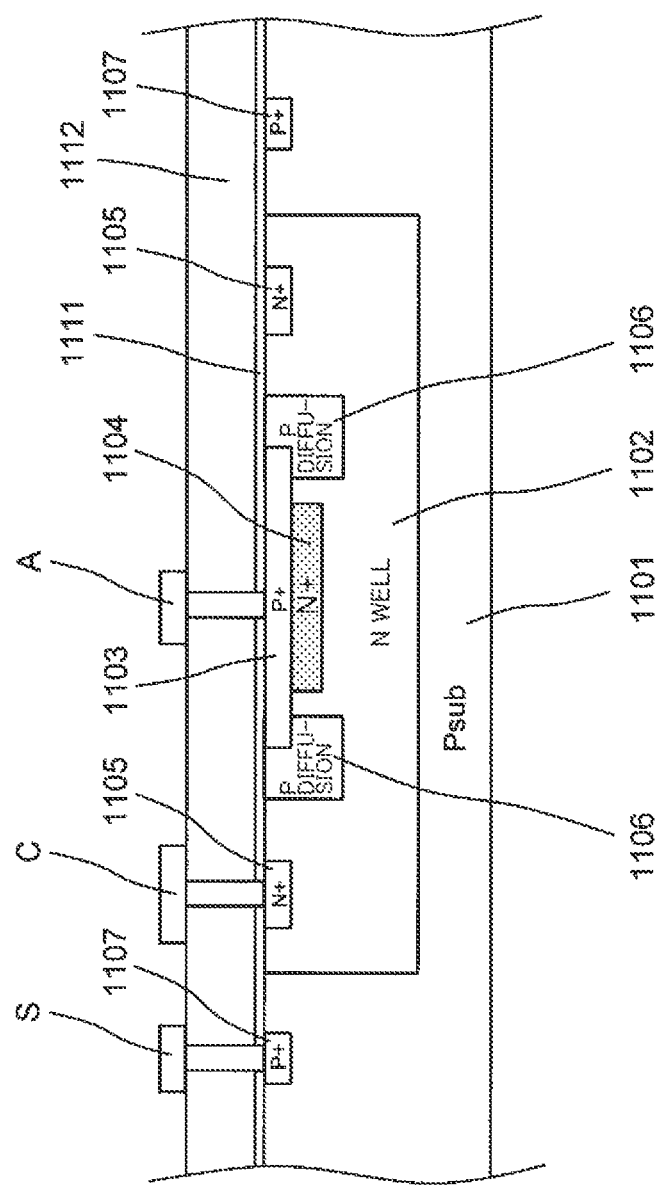
FIG. 9 is a sectional explanatory view of the structure of an existing avalanche photodiode.
Figure 10:
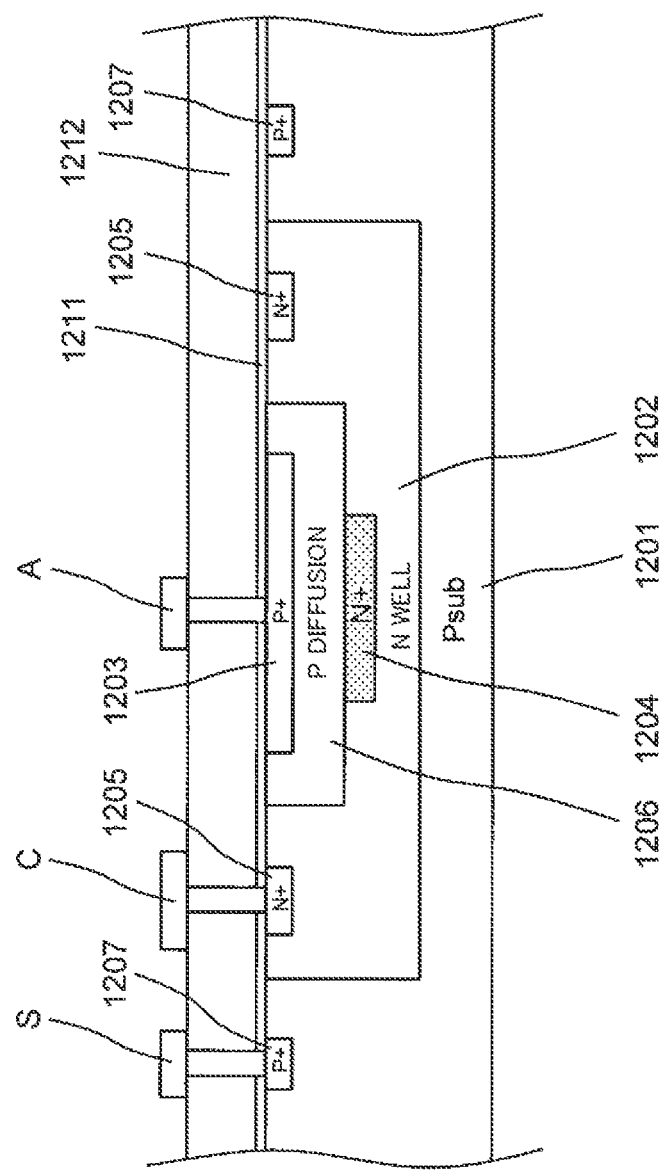
FIG. 10 is a sectional explanatory view of the structure of an existing avalanche photodiode.

An avalanche photodiode according to a fifth embodiment of the present invention will be described with reference to FIG. 7. FIG. 7 is a sectional view of the avalanche photodiode according to the fifth embodiment of the present invention. The avalanche photodiode according to the fifth embodiment has the same configuration as in the avalanche photodiode according to the fourth embodiment except for an N-type buried diffusion layer 55 formed between the N-type diffusion layer 3 serving as the cathode diffusion layer and the N-type buried diffusion layer 6.

Compared with the fourth embodiment according to the present invention, the structure basically further enables reduction in the effect due to defects in the STI (Shallow Trench Isolation) portion. In general, fine processing employs STI as fine diffusion isolation. However, STI, which involves etching of Si and embedding with an oxide film, inevitably contains defects.

In the avalanche photodiode according to the fifth embodiment, the high-concentration N-type buried diffusion layer 55, which is disposed between the N-type diffusion layer 3 serving as the cathode diffusion layer and the N-type buried diffusion layer 6, is formed so as to extend, beyond the selective oxide film STI 11, toward the low-concentration P-type diffusion layer 2 (first-conductivity-type semiconductor layer), namely, the light-receiving region. The N-type buried diffusion layer 55 is an example of the fourth second-conductivity-type semiconductor layer.

In this way, a PN junction is not formed in the selective oxide film STI 11 by crawling up of the N-type buried diffusion layer 55, to thereby provide an avalanche photodiode structure that is not affected by defects of the selective oxide film STI 11.

In general, a diffusion layer formed by ion implantation has a concentration profile having a peak at a depth that depends on the implantation energy; heat treatment causes diffusion from the peak position as the center to the shallow side and the deep side; and the diffusion to the shallow side is referred to as "crawling up". When the N-type buried diffusion layer is disposed outside relative to the selective oxide film STI, diffusion may crawl up but is stopped at the STI, so that the P-type diffusion layer and the N-type diffusion layer extend through the STI (form a PN junction). Basically, a PN junction extending through (passing across) STI containing defects may cause leakage, which is not preferred. For this reason, as in the fifth embodiment, the N-type diffusion layer may be formed so as to extend inward relative to STI, so that the "crawling up" portion of the N-type diffusion layer covers the STI and the STI is present within the N-type diffusion layer. This prevents leakage, and leads to prevention of degradation of noise characteristics.

As with the above-described first to fourth embodiments, the avalanche photodiode according to the fifth embodiment may be constituted with inverted polarities, which clearly provides the same results.

As has been described, in avalanche photodiodes according to the present invention, edge breakdown and tunneling mode due to a high-concentration avalanche junction are avoided, and a uniform distribution of electric field strength is provided. Simultaneously, another N-type buried diffusion layer may be formed under the cathode N well diffusion layer. As a result, an increase in the cathode resistance is avoided without any increase in the costs and the number of steps; and the voltage applied to the cathode electrode C is applied to the avalanche junction with smaller loss. Thus, a high-performance avalanche photodiode that has an increased avalanche detection probability is obtained.

Incidentally, the above-described first to fifth embodiments have been described with typical examples in which the first conductivity type is a P type and the second conductivity type is an N type; alternatively, such devices can be constituted with inverted conductivity types.

The above-described first to fifth embodiments have been described with avalanche photodiodes employing, as the first-conductivity-type semiconductor substrate, the silicon semiconductor substrate 1. However, the first-conductivity-type semiconductor substrate is not limited to this, and may be a substrate formed of another material such as InP.

Embodiments according to the present invention have been specifically described. However, the present invention is not limited to these embodiments, and the embodiments can be changed in various ways within the scope of the present invention. For example, features described in the first to fifth embodiments may be appropriately combined to provide an embodiment according to the present invention.

In summary, the present invention and embodiments are as follows.

An avalanche photodiode according to an aspect of the present invention includes, a first-conductivity-type semiconductor layer 2 formed within a first-conductivity-type semiconductor substrate 1;

a first second-conductivity-type semiconductor layer 3 formed within the semiconductor substrate 1 so as to surround, in plan view for the semiconductor substrate 1, with a gap width, the first-conductivity-type semiconductor layer 2;

a second second-conductivity-type semiconductor layer 5, 25 formed, within the semiconductor substrate 1, deeper than the first-conductivity-type semiconductor layer 2 and in contact with at least a portion of the bottom portion of the first-conductivity-type semiconductor layer 2; and a third second-conductivity-type semiconductor layer 6 formed, within the semiconductor substrate 1, deeper than the second second-conductivity-type semiconductor layer 5, 25 and in contact with the bottom portion of the second second-conductivity-type semiconductor layer 5, 25, wherein the first-conductivity-type semiconductor layer 2 and the second second-conductivity-type semiconductor layer 5, 25 form an avalanche junction, and the first second-conductivity-type semiconductor layer 3 and the third second-conductivity-type semiconductor layer 6 are connected together such that the semiconductor substrate 1 and the first-conductivity-type semiconductor layer 2 are electrically isolated from each other.

In this configuration in which, for example, the first conductivity type is a P type and the second conductivity type is an N type, the third second-conductivity-type semiconductor layer 6 on the cathode side and the second second-conductivity-type semiconductor layer 5, 25 forming the avalanche junction are separately formed. As a result, even when a potential drop on the cathode side causes an increase in the potential at and near the edge of the first-conductivity-type semiconductor layer 2 on the anode side, the third second-conductivity-type semiconductor layer 6 is formed deeper than the second second-conductivity-type semiconductor layer 5, 25, so that the third second-conductivity-type semiconductor layer 6 is disposed farther from the first-conductivity-type semiconductor layer 2. As a result, the electric field strength is decreased, to provide a uniform distribution of electric field strength.

In addition, the first second-conductivity-type semiconductor layer 3 and the third second-conductivity-type semiconductor layer 6 are connected together such that the semiconductor substrate 1 and the first-conductivity-type semiconductor layer 2 are electrically isolated from each other. As a result, a virtual guard ring is formed between the first-conductivity-type semiconductor layer 2 and the first second-conductivity-type semiconductor layer 3, to thereby prevent edge breakdown.

In addition, the first-conductivity-type semiconductor layer 2, which forms an avalanche junction together with the second second-conductivity-type semiconductor layer 5, 25, is formed at a low concentration, so that noise of tunneling mode is avoided.

Therefore, edge breakdown and noise of tunneling mode are avoided and a uniform distribution of electric field strength is provided, to thereby achieve uniform operation over the whole region of the avalanche junction.

In the avalanche photodiode according to an embodiment, the second second-conductivity-type semiconductor layer 25 is smaller than, in plan view for the semiconductor substrate 1, the bottom portion of the first-conductivity-type semiconductor layer 2.

In this embodiment, in plan view for the semiconductor substrate 1, the second second-conductivity-type semiconductor layer 25 is formed smaller than the bottom portion of the first-conductivity-type semiconductor layer 2. As a result, electric field strength does not become high in the edge portion, so that edge breakdown is avoided with more certainty.

The avalanche photodiode according to another embodiment includes a fourth second-conductivity-type semiconductor layer 35, 55 formed between the first second-conductivity-type semiconductor layer 3 and the third second-conductivity-type semiconductor layer 6 so as to be in contact with at least a portion of the bottom portion of the first second-conductivity-type semiconductor layer 3, wherein the fourth second-conductivity-type semiconductor layer 35, 55 electrically connects together the first second-conductivity-type semiconductor layer 3 and the third second-conductivity-type semiconductor layer 6.

In this embodiment, the fourth second-conductivity-type semiconductor layer 35, 55, which is formed between the first second-conductivity-type semiconductor layer 3 and the third second-conductivity-type semiconductor layer 6 so as to be in contact with at least a portion of the bottom portion of the first second-conductivity-type semiconductor layer 3 and electrically connects together the first second-conductivity-type semiconductor layer 3 and the third second-conductivity-type semiconductor layer 6, enables a reduction in the resistance between the first second-conductivity-type semiconductor layer 3 and the third second-conductivity-type semiconductor layer 6, to provide a uniform potential to the avalanche junction.

The avalanche photodiode according to another embodiment includes an oxide film 11 formed so as to isolate, from each other, the first-conductivity-type semiconductor layer 2 and the first second-conductivity-type semiconductor layer 3, wherein the fourth second-conductivity-type semiconductor layer 55 extends toward, beyond the oxide film 11, the first-conductivity-type semiconductor layer 2.

In this embodiment, the fourth second-conductivity-type semiconductor layer 55 extends toward the first-conductivity-type semiconductor layer 2, beyond the oxide film 11 formed so as to isolate from each other the first-conductivity-type semiconductor layer 2 and the first second-conductivity-type semiconductor layer 3. As a result, a PN junction is not formed in the oxide film 11 due to crawling up of the fourth second-conductivity-type semiconductor layer 55, to thereby achieve a structure not affected by defects of the oxide film 11.

REFERENCE SIGNS LIST 1 silicon semiconductor substrate (first-conductivity-type semiconductor substrate)
2 low-concentration P-type diffusion layer (first-conductivity-type semiconductor layer)
3 low-concentration N-type diffusion layer (first second-conductivity-type semiconductor layer)
4 low-concentration P-type diffusion layer
5, 25 N-type buried diffusion layer (second second-conductivity-type semiconductor layer)
6 N-type buried diffusion layer (third second-conductivity-type semiconductor layer)
7 high-concentration P-type diffusion layer
8 high-concentration N-type diffusion layer
9 gate polysilicon
10 virtual guardring
11 selective oxide film STI (oxide film)
12 gate oxide film
13 silicon oxide film
A anode electrode
C cathode electrode
S substrate electrode
35, 55 N-type buried diffusion layer (fourth second-conductivity-type semiconductor layer)

The invention claimed is:

1. An avalanche photodiode comprising:
a first-conductivity-type semiconductor layer formed within a first-conductivity-type semiconductor substrate;
a first second-conductivity-type semiconductor layer formed within the semiconductor substrate so as to surround, in plan view for the semiconductor substrate, with a gap width, the first-conductivity-type semiconductor layer;
a second second-conductivity-type semiconductor layer formed, within the semiconductor substrate, deeper than the first-conductivity-type semiconductor layer and in contact with at least a portion of a bottom portion of the first-conductivity-type semiconductor layer;
a third second-conductivity-type semiconductor layer formed, within the semiconductor substrate, deeper than the second second-conductivity-type semiconductor layer and in contact with a bottom portion of the second second-conductivity-type semiconductor layer;
a fourth second-conductivity-type semiconductor layer formed between the first second-conductivity-type semiconductor layer and the third second-conductivity-type semiconductor layer so as to be in contact with at least a portion of a bottom portion of the first second-conductivity-type semiconductor layer;
an oxide film formed so as to isolate, from each other, the first-conductivity-type semiconductor layer and the first second-conductivity-type semiconductor layer; and
a fifth second-conductivity-type semiconductor layer formed in an upper portion of the first second-conductivity-type semiconductor layer and having a higher impurity concentration than the first second-conductivity-type semiconductor layer,
wherein the first-conductivity-type semiconductor layer and the second second-conductivity-type semiconductor layer form an avalanche junction,
the first second-conductivity-type semiconductor layer and the third second-conductivity-type semiconductor layer are electrically connected together via the fourth second-conductivity-type semiconductor layer such that the semiconductor substrate and the first-conductivity-type semiconductor layer are electrically isolated from each other, and the fourth second-conductivity-type semiconductor layer extends toward, beyond the oxide film, the first-conductivity-type semiconductor layer.

2. The avalanche photodiode according to claim 1, wherein the second second-conductivity-type semiconductor layer is smaller than, in plan view for the semiconductor substrate, the bottom portion of the first-conductivity-type semiconductor layer.

3. An avalanche photodiode comprising:
a first-conductivity-type semiconductor layer formed within a first-conductivity-type semiconductor substrate;
a first second-conductivity-type semiconductor layer formed within the semiconductor substrate so as to surround, in plan view for the semiconductor substrate, with a gap width, the first-conductivity-type semiconductor layer;
a second second-conductivity-type semiconductor layer formed, within the semiconductor substrate, deeper than the first-conductivity-type semiconductor layer and in contact with at least a portion of a bottom portion of the first-conductivity-type semiconductor layer;
a third second-conductivity-type semiconductor layer formed, within the semiconductor substrate, deeper than the second second-conductivity-type semiconductor layer and in contact with a bottom portion of the second second-conductivity-type semiconductor layer;
a fourth second-conductivity-type semiconductor layer formed between the first second-conductivity-type semiconductor layer and the third second-conductivity-type semiconductor layer so as to be in contact with at least a portion of a bottom portion of the first second-conductivity-type semiconductor layer; and
a virtual guard ring formed between the first-conductivity-type semiconductor layer and the first second-conductivity-type semiconductor layer and having a lower concentration than the third second-conductivity-type semiconductor layer,
wherein the first-conductivity-type semiconductor layer and the second second-conductivity-type semiconductor layer form an avalanche junction,
the first second-conductivity-type semiconductor layer and the third second-conductivity-type semiconductor layer are connected together such that the semiconductor substrate and the first-conductivity-type semiconductor layer are electrically isolated from each other,
the second second-conductivity-type semiconductor layer is smaller than, in plan view for the semiconductor substrate, the bottom portion of the first-conductivity-type semiconductor layer, and
the fourth second-conductivity-type semiconductor layer electrically connects together the first second-conductivity-type semiconductor layer and the third second-conductivity-type semiconductor layer.

4. The avalanche photodiode according to claim 3, wherein the fourth second-conductivity-type semiconductor layer has a higher concentration than a portion of the first second-conductivity-type semiconductor layer, the portion of the first second-conductivity-type semiconductor layer being in contact with the fourth second-conductivity-type semiconductor layer, and than a portion of the third second-conductivity-type semiconductor layer, the portion of the third second-conductivity-type semiconductor layer being in contact with the fourth second-conductivity-type semiconductor layer.

5. The avalanche photodiode according to claim 3, comprising:
an oxide film formed so as to isolate, from each other, the first-conductivity-type semiconductor layer and the first second-conductivity-type semiconductor layer;
wherein the fourth second-conductivity-type semiconductor layer extends toward, beyond the oxide film, the first-conductivity-type semiconductor layer.

6. An avalanche photodiode comprising:
a first-conductivity-type semiconductor layer formed within a first-conductivity-type semiconductor substrate;
a first second-conductivity-type semiconductor layer formed within the semiconductor substrate so as to surround, in plan view for the semiconductor substrate, with a gap width, the first-conductivity-type semiconductor layer;
a second second-conductivity-type semiconductor layer formed, within the semiconductor substrate, deeper than the first-conductivity-type semiconductor layer and in contact with at least a portion of a bottom portion of the first-conductivity-type semiconductor layer;
a third second-conductivity-type semiconductor layer formed, within the semiconductor substrate, deeper than the second second-conductivity-type semiconductor layer and in contact with a bottom portion of the second second-conductivity-type semiconductor layer; and
a fourth second-conductivity-type semiconductor layer formed between the first second-conductivity-type semiconductor layer and the third second-conductivity-type semiconductor layer so as to be in contact with at least a portion of a bottom portion of the first second-conductivity-type semiconductor layer, and having a higher concentration than a portion of the first second-conductivity-type semiconductor layer, the portion of the first second-conductivity-type semiconductor layer being in contact with the fourth second-conductivity-type semiconductor layer, and than a portion of the third second-conductivity-type semiconductor layer, the portion of the third second-conductivity-type semiconductor layer being in contact with the fourth second-conductivity-type semiconductor layer; and
a fifth second-conductivity-type semiconductor layer formed in an upper portion of the first second-conductivity-type semiconductor layer and having a higher impurity concentration than the first second-conductivity-type semiconductor layer,
wherein the first-conductivity-type semiconductor layer and the second second-conductivity-type semiconductor layer form an avalanche junction,
the first second-conductivity-type semiconductor layer and the third second-conductivity-type semiconductor layer are connected together such that the semiconductor substrate and the first-conductivity-type semiconductor layer are electrically isolated from each other, and
the fourth second-conductivity-type semiconductor layer electrically connects together the first second-conductivity-type semiconductor layer and the third second-conductivity-type semiconductor layer.

* * * * *